United States Patent
Park

(10) Patent No.: US 7,691,651 B2
(45) Date of Patent: Apr. 6, 2010

(54) METHOD FOR MANUFACTURING NITRIDE-BASED SEMICONDUCTOR DEVICE

(75) Inventor: Hee Seok Park, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 832 days.

(21) Appl. No.: 11/448,866

(22) Filed: Jun. 8, 2006

(65) Prior Publication Data

US 2006/0281205 A1    Dec. 14, 2006

(30) Foreign Application Priority Data

Jun. 10, 2005    (KR) .................. 10-2005-0049985

(51) Int. Cl.
*H01L 21/00* (2006.01)

(52) U.S. Cl. ........... 438/22; 257/E21.108; 257/E21.121

(58) Field of Classification Search .................. 438/46; 257/E21.108, E21.121
See application file for complete search history.

(56) References Cited

U.S. PATENT DOCUMENTS

| | | | |
|---|---|---|---|
| 6,391,748 B1 * | 5/2002 | Temkin et al. | 438/478 |
| 6,606,335 B1 | 8/2003 | Kuramata et al. | |
| 6,613,143 B1 | 9/2003 | Melnik et al. | |
| 2002/0005566 A1 * | 1/2002 | Weber et al. | 257/618 |
| 2003/0057434 A1 | 3/2003 | Hata et al. | |
| 2006/0091500 A1 | 5/2006 | Lee et al. | |
| 2007/0126009 A1 | 6/2007 | Sakai et al. | |

FOREIGN PATENT DOCUMENTS

| | | |
|---|---|---|
| JP | 2000-228535 | 8/2000 |
| JP | 2002-343718 | 11/2002 |
| JP | 2004-048076 | 2/2004 |
| JP | 2004-099405 | 4/2004 |
| JP | 2004-296636 | 10/2004 |
| JP | 2005-142543 | 6/2005 |
| JP | 2006-128626 | 5/2006 |
| WO | WO 00/04615 | 1/2000 |

OTHER PUBLICATIONS

Japanese Office Action issued in Japanese Patent Application No. JP 2006-156027, dated on Jun. 9, 2009.

* cited by examiner

*Primary Examiner*—W. David Coleman
*Assistant Examiner*—Sonya D McCall-Shepard
(74) *Attorney, Agent, or Firm*—McDermott Will & Emery LLP

(57) ABSTRACT

In a method for manufacturing a high-quality GaN-based semiconductor layer on a substrate of different material, an AlN nucleation layer is grown on a substrate, a GaN buffer layer is grown on the AlN nucleation layer, and the substrate annealed. The AlN nucleation layer is formed to have a thickness greater than a critical radius of a nucleus of AlN crystal and less than a critical resilient thickness of AlN, and the GaN buffer layer is formed to have a thickness greater than a critical radius of a nucleus of GaN crystal and less than a critical resilient thickness of GaN. Annealing time is greater than $L^2/D_{Ga}$ where L indicates a diffusion distance of Ga, and $D_{Ga}$ indicates a diffusion coefficient of Ga in the AlN nucleation layer.

11 Claims, 3 Drawing Sheets

METHOD FOR MANUFACTURING NITRIDE-BASED SEMICONDUCTOR DEVICE

RELATED APPLICATION

The present invention is based on, and claims priority from, Korean Application Number 2005-49985, filed Jun. 10, 2005, the disclosure of which is incorporated by reference herein in its entirety.

BACKGROUND OF THE INVENTION

1. Field of the Invention

The present invention relates to a method for manufacturing a nitride-based semiconductor device, and, more particularly, to a method for manufacturing a GaN-based semiconductor layer on a heterogeneous substrate.

2. Description of the Related Art

As group III nitride light emitting diodes (LED) employing an $Al_xIn_yGa_{(1-x-y)}N$-based (where $0 \leq x \leq 1$, $0 \leq y \leq 1$, $0 \leq x+y \leq 1$; which will be referred to as "GaN-based" hereinafter) semiconductor have been developed, GaN semiconductors have been spotlighted as a light source of white, green, or blue light, and many advances have been made in related technology. However, the most important problem in terms of growth of GaN-based semiconductors is that a substrate, upon which the GaN-based semiconductor is grown, has yet to be remarkably enhanced in quality.

In order to solve the problems of the substrate for growing the GaN-based semiconductor, various attempts have been made, including usage of a silicon substrate as a substitute substrate. Conventionally, the GaN-based material has been grown on a sapphire substrate by MOCVD (metal organic chemical vapor deposition). However, due to lattice mismatch and thermal expansion coefficient differences between the sapphire substrate and the GaN-based semiconductor, the GaN-based semiconductor grown on the sapphire substrate has a negative crystallinity, causing lots of defects in the sapphire substrate. Additionally, the sapphire substrate is not only relatively expensive, but also inappropriate for large-scale devices.

On the contrary, silicon (Si) substrates are appropriate for the large-scale devices in addition to being inexpensive, and allow integration of other Si electronic devices or optical devices thereon. Due to these advantages, the Si substrate has been spotlighted as a substitute for the sapphire substrate. However, as with the sapphire substrate, due to lattice mismatch and thermal expansion coefficient differences between the Si substrate and the GaN-based semiconductor, it is difficult to grow a GaN-based semiconductor having good quality on the Si substrate. In order to solve this problem, attempts have been made to grow buffer layers formed from a variety of materials. Especially, various investigations into growing AlN or GaN buffer layers have been conducted, although satisfactory results have yet to be obtained. U.S. patent application Ser. No. 09/900,833 discloses a method for growing a GaN single crystal by an HVPE (Hydride Vapor Phase Epitaxy) growth process.

FIG. 1 is a side sectional view illustrating a nitride-based semiconductor device 10 manufactured according to a conventional method. Referring to FIG. 1, a low temperature AlN buffer layer 13 is grown on a Si substrate 11 having a primary plane of (111) at 500° C. to 700° C. by MOCVD. The semiconductor device 10 further comprises a desired GaN semiconductor layer 19 on the AlN buffer layer 13. The low temperature AlN buffer layer 13 serves to relieve stress caused by lattice mismatch and thermal expansion coefficient differences between the Si substrate 11 and the GaN semiconductor layer 19. The construction of the low temperature AlN buffer layer 13 and the method for manufacturing the same are known in the art. Instead of the low temperature AlN buffer layer 13, super-lattice layers can be formed by alternately stacking AlN layers and GaN layers. The super-lattice structure can prevent, to some degree, crystal defects, such as dislocations, from propagating.

However, even though the buffer layer 13 is grown on the Si substrate 11, the GaN semiconductor layer grown on the buffer layer 13 has many defects due to limitations of physical properties thereof. Accordingly, it is necessary to further enhance the crystallinity of the GaN layer heterogeneously grown on a substrate of for example Si.

SUMMARY OF THE INVENTION

The present invention has been made in view of the above problems, and it is an object according to certain embodiments of the present invention to provide a method for manufacturing a nitride-based semiconductor device, which allows easy growth of a high quality GaN-based semiconductor layer on a heterogeneous substrate, such as a silicon substrate.

In accordance with one aspect of the present invention, the above and other objects can be accomplished by the provision of a method for manufacturing a nitride-based semiconductor device, comprising steps of: growing an AlN nucleation layer on a substrate; growing a GaN buffer layer on the AlN nucleation layer; annealing the substrate, wherein the AlN nucleation layer is formed to have a thickness greater than a critical radius of a nucleus of AlN crystal and less than a critical resilient thickness of AlN, the GaN buffer layer is formed to have a thickness greater than a critical radius of a nucleus of GaN crystal and less than a critical resilient thickness of GaN, and an annealing time is greater than $L^2/D_{Ga}$ where L indicates a diffusion distance of Ga, and $D_{Ga}$ indicates a diffusion coefficient of Ga in the AlN nucleation layer.

Preferably, the step of growing the AlN nucleation layer and the step of growing the GaN buffer layer are performed in-situ by hydride vapor phase epitaxy (HVPE). As HVPE is used for growing the AlN nucleation layer and the GaN buffer layer in-situ, a rapid growth rate can be achieved.

Preferably, the substrate comprises a material selected from the group consisting of sapphire, silicon carbide, silicon, zinc oxide, boron nitride, lithium aluminate, lithium niobate, germanium, aluminum nitride and lithium gallate.

Preferably, the AlN nucleation layer is grown at a temperature of 800° C.~1,200° C. by HVPE. More preferably, the AlN nucleation layer is grown at a temperature of 1,000° C.~1,100° C. by HVPE. As such, since the AlN nucleation layer is grown at high temperature, a crystal nucleus can be easily created at an initial stage, and is then gradually promoted to lateral growth. The AlN nucleation layer serves as a desirable seed layer for growth of the subsequent GaN buffer layer. In particular, since the AlN nucleation layer is formed to have a thickness less than the critical resilient thickness, defects such as dislocations are suppressed from propagating to the GaN buffer layer grown by the subsequent process.

Preferably, the GaN buffer layer is grown at a temperature of 500° C.~700° C. by HVPE. More preferably, the GaN buffer layer is grown at a temperature of 500° C.~600° C. by HVPE. As such, since the GaN buffer layer is grown at low temperature, the GaN buffer layer is continuously grown in the lateral direction from the AlN nucleation layer, whereby the GaN buffer layer serves as a desirable base layer for growth of a subsequent GaN-based semiconductor layer. In particular, since the GaN buffer layer is formed to have a thickness less than the critical resilient thickness, defects such as dislocations are suppressed from propagating to the GaN-based semiconductor layer grown by the subsequent process.

Preferably, annealing is performed at a temperature of 500° C.~900° C. under nitrogen (N$_2$) atmosphere. More preferably, annealing is performed at a temperature of 800° C.~900° C. under nitrogen atmosphere. Annealing serves to repair damages of an inner structure of the AlN nucleation layer and the GaN buffer layer grown on the substrate. Additionally, with the annealing time greater than $L^2/D_{Ga}$, Ga atoms can be sufficiently diffused and located at more stable sites.

Preferably, the method further comprises growing a GaN-based semiconductor layer after annealing. The method of the invention may be applied to a method of manufacturing GaN-based semiconductor optical diodes, such as GaN-based light emitting diodes or GaN-based semiconductor laser diodes.

Herein, the terms "GaN-based material" or "GaN-based semiconductor" mean binary, ternary, or quaternary semiconductors represented by the formula $Al_xIn_yGa_{(1-x-y)}N$-based (where $0 \leq x \leq 1$, $0 \leq y \leq 1$, $0 \leq x+y \leq 1$).

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
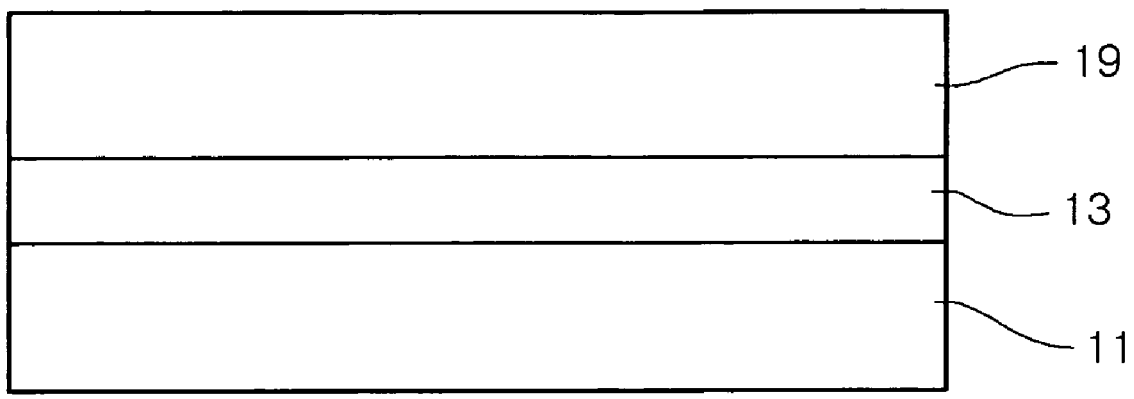
FIG. 1 is a side sectional view illustrating a nitride-based semiconductor device manufactured according to a conventional method.

Preferred embodiments will now be described in detail with reference to the accompanying drawings. It should be noted that the embodiments of the invention can take various forms, and that the present invention is not limited to the embodiments described herein. The embodiments of the invention are described so as to enable those having an ordinary knowledge in the art to have a better understanding of the invention. Accordingly, shape and size of components of the invention are enlarged in the drawings for clear description of the invention. Like components are indicated by the same reference numerals throughout the drawings.

Figure 2:
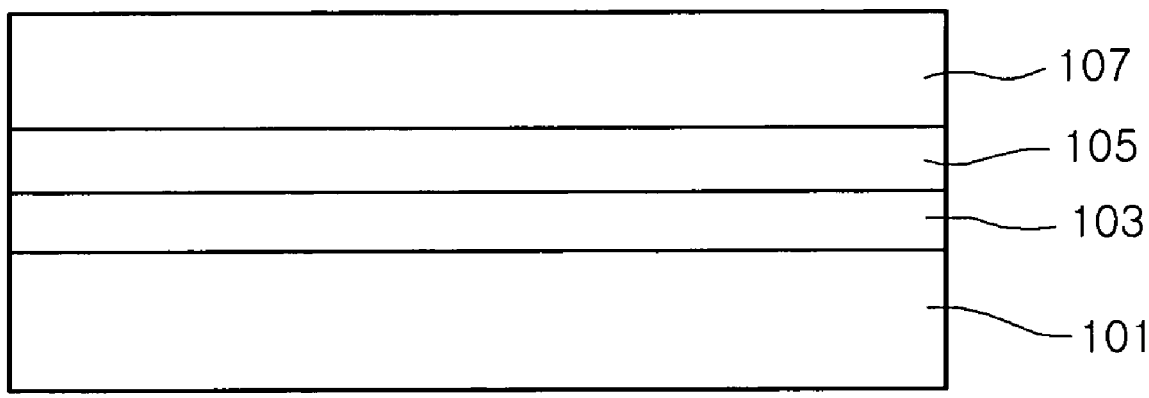
FIG. 2 is a side sectional view illustrating a nitride-based semiconductor device manufactured according to an embodiment of the present invention.

FIG. 2 is a side sectional view illustrating a nitride-based semiconductor device 100 manufactured according to an embodiment of the invention. Referring to FIG. 2, after an AlN nucleation layer 103 and a GaN buffer layer 105 are sequentially formed on a substrate 101 formed of a different material from the GaN buffer layer 105, a desired GaN-based GaN semiconductor layer, for example, a GaN semiconductor layer 107, is grown on the GaN buffer layer 105. The substrate 101 may be formed of a material selected from the group consisting of sapphire, silicon carbide, silicon, zinc oxide, boron nitride, lithium aluminate, lithium niobate, germanium, aluminum nitride and lithium gallate. For example, the substrate 101 can be a silicon substrate. The silicon substrate provides various advantages in view of easy integration of other silicon-based electronic diodes and lower manufacturing costs.

The AlN nucleation layer 103 is formed to have a thickness $h_{AlN}$ in the range of $R_{cr1} < h_{AlN} < h_{cr1}$. Herein, $R_{cr1}$ indicates a critical radius of a nucleus of AlN crystal, and $h_{cr1}$ indicates a critical resilient thickness of AlN. The GaN buffer layer 105 is formed to have a thickness $h_{GaN}$ in the range of $R_{cr2} < h_{GaN} < h_{cr2}$. Herein, $R_{cr2}$ indicates a critical radius of a nucleus of GaN crystal, and $h_{cr2}$ indicates a critical resilient thickness of GaN. As such, the AlN and GaN buffer layers 103 and 105 are formed to have the thicknesses less than the respective critical resilient thicknesses, thereby suppressing dislocations from propagating to an upper layer.

As described below, an upper region of the AlN nucleation layer 103 is a predominant region of lateral growth. Thus, the upper surface of the AlN nucleation layer 103 constitutes a good crystal plane. Additionally, as described below, since annealing is performed at a temperature of 500° C. or more (preferably, at a temperature of 800° C.~900° C.) after the AlN nucleation layer 103 and the GaN buffer layer 105 are grown on the substrate 101, the AlN nucleation layer 103, the GaN buffer layer 105 and the GaN semiconductor layer 107 have enhanced crystallinity in comparison to the case of the conventional method. As a result, according to the invention, in spite of lattice mismatch and thermal expansion coefficient differences between the heterogeneous substrate 101 and the GaN semiconductor layer 107 formed thereon, a high quality GaN semiconductor layer can be obtained.

A method for manufacturing a nitride-based semiconductor device according to an embodiment of the invention will be described as follows. FIGS. 3 to 6 are step diagrams illustrating a method of manufacturing a GaN-based semiconductor device according to one embodiment of the invention.

Figure 3:
FIGS. 3 to 6 are step diagrams illustrating a method of manufacturing a GaN-based semiconductor device according to an embodiment of the present invention.

First, referring to FIG. 3, a heterogeneous substrate 101 for growing a GaN-based material is prepared. As described above, the heterogeneous substrate 101 may be formed of a material selected from the group consisting of sapphire, silicon carbide, silicon, zinc oxide, boron nitride, lithium aluminate, lithium niobate, germanium, aluminum nitride and lithium gallate. In particular, as for the heterogeneous substrate 101, a silicon substrate may provide various advantages in view of productivity, costs, and integration capability of other electronic devices thereon.

Figure 4:
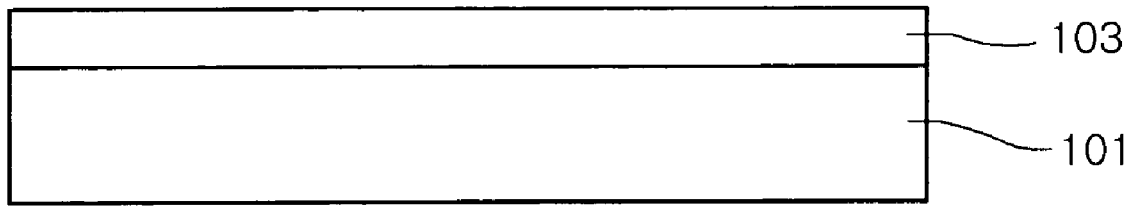

Next, as shown in FIG. 4, HVPE is performed using an Al source gas and a nitrogen source gas to grow an AlN nucleation layer 102 on the substrate 101. The Al source gas includes, for example, aluminum trichloride $AlCl_3$. Aluminum trichloride can be formed by supplying HCl gas to aluminum. The nitrogen source gas includes $NH_3$ gas.

As described above, the AlN nucleation layer 103 is formed to have a thickness in the range of $R_{cr1} < h_{AlN} < h_{cr1}$, where $R_{cr1}$ is a thickness of AlN nucleation layer, $h_{AlN}$ is a critical radius of nucleus of AlN crystal, and $h_{cr1}$ is a critical resilient thickness of AlN. At this time, the AlN nucleation layer 103 is preferably grown at a temperature of 800° C.~1,200° C. (more preferably, 1,000° C.~1,100° C.). As such, the AlN nucleation layer 103 is grown at high temperature, so that a crystal nucleus greater than the critical radius $R_{c1}$ of the crystal nucleus can be easily created at an initial stage, and is then gradually promoted to lateral growth. The AlN nucleation layer 103 formed by the lateral growth provides a smooth crystal upper surface. Accordingly, the AlN nucleation layer 103 serves as a desirable seed layer for growth of a subsequent GaN buffer layer. In particular, since the AlN nucleation layer 103 is formed to have a thickness less than the critical resilient thickness (about 1,000 Å~2,000 Å) of AlN, defects such as dislocations are substantially suppressed from propagating to the GaN buffer layer grown during a subsequent process.

Figure 5:
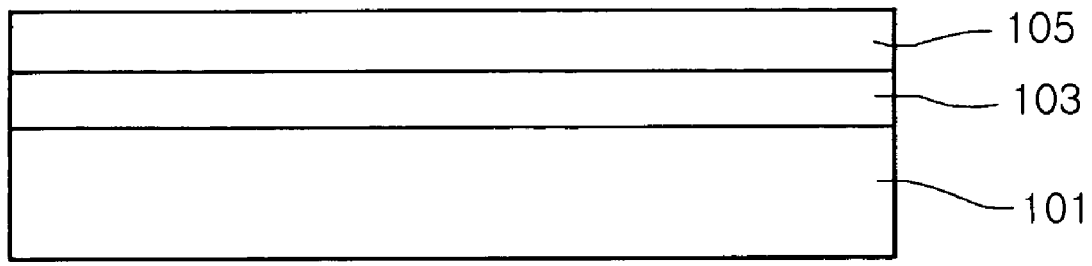

Next, as shown in FIG. 5, HVPE is performed using a Ga source gas and a nitrogen source gas to grow a GaN buffer layer 105 on the AlN nucleation layer 103. At this time, growth of the GaN buffer layer 105 is performed in-situ within a reaction chamber, which is also used for growing the AlN nucleation layer 103. The Ga source gas includes, for example, gallium chloride. Gallium chloride can be formed by supplying HCl gas to gallium. The nitrogen source gas includes $NH_3$ gas. As such, the AlN nucleation layer 103 and the GaN buffer layer 105 are grown in-situ using HVPE, so that a rapid growth rate can be achieved, thereby decreasing processing time.

As described above, the GaN buffer layer 105 is formed to have a thickness in the range of $R_{cr2}<h_{GaN}<h_{cr2}$ where $R_{cr2}$ is a critical radius of nucleus of GaN crystal, $h_{GaN}$ is a thickness of GaN buffer layer, and $h_{cr2}$ is a critical resilient thickness of GaN. At this time, the GaN buffer layer 105 is preferably grown at a temperature of 500° C.~700° C. (more preferably, 500° C.~600° C.). As such, the GaN buffer layer 105 is grown at low temperature, so that the GaN buffer layer 105 can be grown predominantly in the lateral direction from the AlN nucleation layer 103. Accordingly, the GaN buffer layer 105 can have a relatively desirable crystal state, and thus serve as a desirable base layer for growth of a subsequent GaN semiconductor layer. In particular, since the GaN buffer layer 105 is formed to have a thickness less than the critical resilient thickness (about 1,000 Å~2,000 Å) of GaN, dislocations are suppressed from propagating to a GaN-based semiconductor layer 107 (see FIG. 6), which is grown during a subsequent process.

Next, the substrate 101 having the GaN buffer layer 105 formed thereon is annealed. Annealing time is greater than $L^2/D_{Ga}$ where L indicates a diffusion distance of Ga, and $D_{Ga}$ indicates a diffusion coefficient of Ga in the AlN nucleation layer. Preferably, annealing is performed at a temperature of 500° C.~900° C. under nitrogen ($N_2$) atmosphere. More preferably, annealing is performed at a temperature of 800° C.~900° C. under nitrogen atmosphere. Annealing serves to repair damage of inner structures of the AlN nucleation layer 103 and GaN buffer layer 105 grown on the substrate. In particular, with an annealing time greater than $L^2/D_{Ga}$, Ga atoms can be sufficiently diffused and located at more stable sites. Thus, annealing greatly enhances the crystallinity of the AlN nucleation layer 103 and the GaN buffer layer 105.

Figure 6:
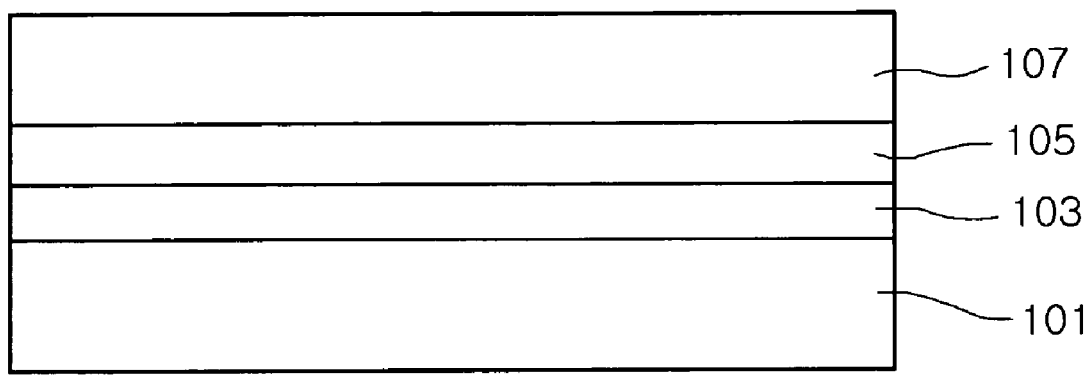

Then, as shown in FIG. 6, a desired GaN semiconductor layer, for example, a GaN semiconductor layer 107, is grown on the GaN buffer layer 105. As a result, a nitride-based semiconductor device 100 according to the invention is completed. The GaN semiconductor layer 107 can be grown by, for example, HVPE or MOCVD. When the GaN semiconductor layer 107 is grown by MOCVD, trimethyl gallium gas can be used as the Ga source gas.

As described above, since the AlN nucleation layer 103 and the GaN buffer layer 105 have enhanced crystallinity in a state wherein the dislocations are substantially suppressed from propagating above the GaN buffer layer 105, the GaN semiconductor layer grown on the GaN buffer layer 105 can have a high grade of crystallinity. The method for manufacturing the nitride-based semiconductor device according to the invention is applicable to a method of manufacturing GaN-based semiconductor optical diodes, such as GaN-based light emitting diodes (LED) or GaN-based semiconductor laser diodes (LD). Since the GaN semiconductor layer 107 grown on the GaN buffer layer 105 exhibits high crystallinity, the GaN-based semiconductor optical devices (LED or LD) can realize high-grade crystallinity and performance.

As apparent from the description, according to preferred embodiments of the invention, a GaN layer is formed on a GaN buffer layer after an AlN nucleation layer and the GaN buffer layer are grown on a heterogeneous substrate, such as a silicon substrate, thereby providing a high quality GaN-based semiconductor layer. The AlN nucleation layer and the GaN buffer layer are grown in-situ by HVPE, thereby reducing processing time. Moreover, the high quality GaN-based crystal layer is formed on the silicon substrate, thereby allowing easy integration of other electronic devices thereon, while lowering manufacturing costs of the nitride light emitting diode.

It should be understood that the embodiments and the accompanying drawings have been described for illustrative purposes and the present invention is limited only by the following claims. Further, those skilled in the art will appreciate that various modifications, additions and substitutions are allowed without departing from the scope and spirit of the invention as set forth in the accompanying claims.

What is claimed is:

1. A method for manufacturing a nitride-based semiconductor device, comprising steps of:
   growing an AlN nucleation layer on a substrate by hydride vapor phase epitaxy (HVPE);
   growing a GaN buffer layer on the AlN nucleation layer by HVPE; and
   annealing the GaN buffer layer for a period of an annealing time,
   wherein the AlN nucleation layer is formed to have a thickness greater than a critical radius of a nucleus of AlN crystal and less than a critical resilient thickness of AlN, the GaN buffer layer is formed to have a thickness greater than a critical radius of a nucleus of GaN crystal and less than a critical resilient thickness of GaN, and the annealing time is greater than $L^2/D_{Ga}$ where L indicates a diffusion distance of Ga, and $D_{Ga}$ indicates a diffusion coefficient of Ga in the AlN nucleation layer.

2. The method as set forth in claim 1, wherein the step of growing the AlN nucleation layer and the step of growing the GaN buffer layer are performed in-situ by HVPE.

3. The method as set forth in claim 1, wherein the substrate comprises a material selected from the group consisting of sapphire, silicon carbide, silicon, zinc oxide, boron nitride, lithium aluminate, lithium niobate, germanium, aluminum nitride, and lithium gallate.

4. The method as set forth in claim 1, wherein the AlN nucleation layer is grown at a temperature of 800° C.~1,200° C. by HVPE.

5. The method as set forth in claim 1, wherein the AlN nucleation layer is grown at a temperature of 1,000° C.~1,100° C. by HVPE.

6. The method as set forth in claim 1, wherein the GaN buffer layer is grown at a temperature of 500° C.~700° C. by HVPE.

7. The method as set forth in claim 1, wherein the GaN buffer layer is grown at a temperature of 500° C.~600° C. by HVPE.

8. The method as set forth in claim 1, wherein annealing is performed at a temperature of 500° C.~900° C. in a nitrogen ($N_2$) atmosphere.

9. The method as set forth in claim 1, wherein annealing is performed at a temperature of 800° C.~900° C. under nitrogen atmosphere.

10. The method as set forth in claim 1, further comprising:
    growing a GaN-based semiconductor layer after the step of annealing the substrate.

11. The method as set forth in claim 1, wherein the method is applied to manufacturing of GaN-based semiconductor optical diodes.

* * * * *